(12) United States Patent
Kim

(10) Patent No.: US 7,365,575 B2
(45) Date of Patent: Apr. 29, 2008

(54) GATED CLOCK LOGIC CIRCUIT

(75) Inventor: Min-Su Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 106 days.

(21) Appl. No.: 11/266,659

(22) Filed: Nov. 2, 2005

(65) Prior Publication Data

US 2006/0097754 A1    May 11, 2006

(30) Foreign Application Priority Data

Nov. 5, 2004    (KR) ...................... 10-2004-0089956

(51) Int. Cl.
*H03K 19/096*    (2006.01)
(52) U.S. Cl. ..................... 326/95; 326/97; 326/98; 327/211; 327/212; 327/291
(58) Field of Classification Search ............ 326/93–98, 326/112, 119, 121; 327/210–212, 164, 291, 327/191
See application file for complete search history.

(56) References Cited

U.S. PATENT DOCUMENTS

| | | | | |
|---|---|---|---|---|
| 5,598,112 | A * | 1/1997 | Phillips ....................... | 326/93 |
| 5,883,529 | A * | 3/1999 | Kumata et al. ............... | 326/93 |
| 6,075,386 | A | 6/2000 | Naffziger | |
| 6,272,667 | B1 | 8/2001 | Minami et al. | |
| 6,281,710 | B1 | 8/2001 | Poirier et al. | |
| 6,377,104 | B2 * | 4/2002 | Cairns et al. ............... | 327/291 |
| 6,411,152 | B1 | 6/2002 | Dobberpuhl ................ | 327/291 |
| 6,496,050 | B2 * | 12/2002 | Lloyd ......................... | 327/407 |
| 6,552,572 | B1 * | 4/2003 | Cheung et al. .............. | 326/93 |
| 6,707,318 | B2 | 3/2004 | Kumar et al. | |
| 6,965,254 | B2 * | 11/2005 | Lundberg .................... | 326/98 |
| 7,002,374 | B2 * | 2/2006 | Anderson et al. ............ | 326/95 |
| 7,042,267 | B1 * | 5/2006 | Pasqualini .................. | 327/291 |
| 2004/0021485 | A1 * | 2/2004 | Kanazawa ................... | 326/83 |

FOREIGN PATENT DOCUMENTS

| | | |
|---|---|---|
| GB | 2413 020 | 10/2005 |
| JP | 11-237447 | 8/1999 |
| JP | 2001-196919 | 7/2001 |

OTHER PUBLICATIONS

English language abstract of Japanese Publication No. 11-237447, Aug. 31, 1999.
English language abstract of Japanese Publication No. 2001-196919, Jul. 19, 2001.
Synplicity, Inc. Application Note "Gated Clock Conversion with Synplicity'Synthesis Products" Jul. 2003, pp. 1-24.

* cited by examiner

*Primary Examiner*—Rexford Barnie
*Assistant Examiner*—Jason Crawford
(74) *Attorney, Agent, or Firm*—Marger Johnson & McCollom, P.C.

(57) ABSTRACT

A gated clock logic circuit includes a pulse generator and a precharged latch. The pulse generator generates a pulse signal in response to a clock signal, and the precharged latch generates a gated clock signal in response to the clock signal, the pulse signal, and a control signal.

22 Claims, 8 Drawing Sheets

GATED CLOCK LOGIC CIRCUIT

CROSS-REFERENCE TO RELATED APPLICATIONS

This U.S. non-provisional patent application claims priority under 35 U.S.C. § 119 from Korean Patent Application No. 2004-89956 filed on Nov. 5, 2004, the entire contents of which are hereby incorporated by reference.

BACKGROUND

Digital logic can generally be characterized as either combinational circuits or sequential circuits. Combinational circuits are based on logic gates, and their outputs are directly determined by the present input values applied to the circuit. Combinational circuits perform operations that are logically specified by a series of Boolean expressions. Sequential circuits may also include logic gates, but additionally employ storage devices referred to as flip-flops. The outputs of storage devices depend not only on the present values of some inputs, but also on the previous values of some inputs. The operation of flip-flops in a sequential logic circuit is typically synchronized by a system clock. Thus the operation of sequential logic circuits is characterized by internal states as well as a time sequence of the inputs thereof.

Most digital systems include a blend of combinational and sequential logic circuits. Examples of storage devices used in sequential logic circuits utilizing flip-flops include latches, registers, counters, static memory arrays, and so forth. Since the operation of flip-flops affects the speed and power of the digital systems, it is very important to effectively design sequential logic circuits in order to achieve high-speed and low-power operation.

A recent trend in the design of digital systems involves the use of gated clock logic circuits to reduce the amount of power consumed by flip-flops. Gated clock logic circuits are structured to apply a clock signal to flip-flops in response to an enable signal only when the flip-flops need to operate, thereby reducing power consumption. An example of a conventional gated clock logic circuit is shown in FIG. 1. Referring to FIG. 1, a gated clock logic circuit 1 generates a gated clock signal GCK which is synchronized with a clock signal CK while a control signal (EN or TE) is active. The performance of the gated clock logic circuit 1 of FIG. 1 is determined by its EtoG time which is a delay time from an activation point of the enable signal (EN or TE) to an output point of the gated clock signal GCK. As shown in FIG. 1, the EtoG time is determined by a transmission path (illustrated as a dotted line in FIG. 1).

SUMMARY

In one exemplary embodiment according to the inventive principles of this patent disclosure, a gated clock logic circuit may include a pulse generator to generate a pulse signal in response to a clock signal, and a precharged latch to generate a gated clock signal in response to the clock signal, the pulse signal, and a control signal. The pulse generator may activate the pulse signal in response to a transition of the clock signal.

The precharged latch may maintain the gated clock signal at an inactive level while the clock signal is inactive. It may also activate the gated clock signal in response to an activation of the pulse signal and the control signal while the clock signal is active. The gated clock signal may be activated, for example, in response to simultaneous activations of the pulse signal and the control signal, and/or it may latch the gated clock signal at the active level when either the pulse signal or the control signal is inactivated. The precharged latch may also include a feedback keeper to maintain the voltage level of an internal node in response to the state of the gated clock signal.

DETAILED DESCRIPTION

Preferred embodiments according to the inventive principles of this patent disclosure will be described below in more detail with reference to the accompanying drawings. The inventive principles may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 2:
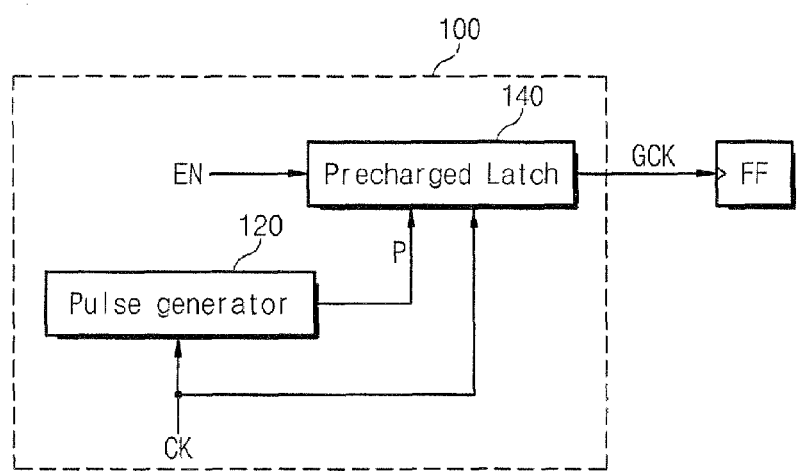
FIG. 2 is a schematic block diagram of an embodiment of a gated clock logic circuit according to the inventive principles of this patent disclosure.

FIG. 2 is a schematic block diagram of an embodiment of a gated clock logic circuit according to the inventive principles of this patent disclosure. The gated clock logic circuit 100 (or referred to as a "gated clock latch circuit") of FIG. 2 generates a gated clock signal GCK that is synchronized with a clock signal CK while a control signal EN is active. The gated clock logic circuit 100 includes a pulse generator 120 and a precharged latch 140. The pulse generator 120 generates a pulse signal P in response to the clock signal CK. For example, the pulse generator 120 may activate the pulse signal P in response to a low-to-high transition (or high-to-low transition) of the clock signal CK. The precharged latch 140 generates the clock signal GCK in response to the control signal EN, the pulse signal P, and the clock signal CK. The gated clock signal GCK may be applied, for example, as a clock signal to a flip-flop FF. For instance, while the control signal EN is inactive, the gated clock signal GCK may be maintained at a specific level by the clock signal CK irrespective of the state of the pulse signal P. When the pulse signal P is activated while the control signal EN is active, the precharged latch 140 generates the gated clock signal GCK having the same waveform as will be described in more detail below.

As described above, the gated clock logic circuit 100 according to the inventive principles of this patent disclosure is structured to generate the gated clock signal GCK in response to a pulse signal P while the control signal EN is active. The gated clock signal CGK may be applied to a flip-flop and/or similar elements (e.g., registers, counters, latches and so forth). Since the gated clock signal GCK is maintained in a specific level irrespective of transitions in the clock signal CK while the control signal EN is inactive, it may be possible to reduce the power consumption of an integrated circuit device having a gated clock logic circuit constructed according to the inventive principles of this patent disclosure.

Figure 3:
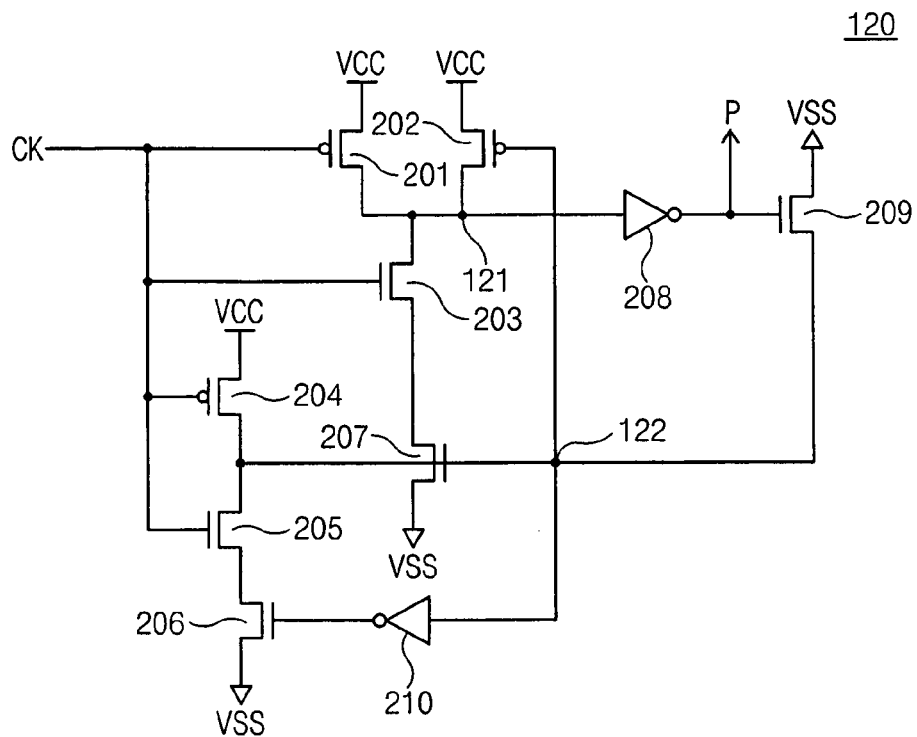
FIG. 3 is a circuit diagram of an example embodiment of a pulse generator according to the inventive principles of this patent disclosure.

FIG. 3 is a circuit diagram of an example embodiment of a pulse generator suitable for use as the pulse generator of FIG. 2 according to the inventive principles of this patent disclosure. Referring to FIG. 3, the pulse generator 120 is structured to generate a pulse signal P in response to the clock signal CK, and includes three PMOS transistors 201, 202 and 204, five NMOS transistors 203, 205, 206, 207 and 209, and two inverters 208 and 210.

The PMOS transistor 201 is connected between a power voltage VCC and an internal node 121, and controlled by the clock signal CK. The PMOS transistor 202 is connected between the power voltage VCC and the internal node 121, and controlled by a voltage level of an internal node 122. The NMOS transistors 203 and 207 are serially connected between the internal node 121 and a ground voltage VSS. The clock signal CK is applied to a gate of the NMOS transistor 203, which is electrically connected to the internal node 121. The PMOS and NMOS transistors 204, 205 and 206 are serially connected between the power voltage VCC and the ground voltage VSS. The gates of the PMOS and NMOS transistors 204 and 205 are connected so as to receive the clock signal CK. The gate of the NMOS transistor 206 is electrically connected to an output terminal of an inverter 210 that has its input connected to the internal node 122. The gate of the NMOS transistor 209 is connected to an output terminal of an inverter 208 and is connected between the internal node 122 and the ground voltage VSS. The input of inverter 208 is connected to the internal node 121.

In operation, the PMOS transistors 201 and 204 are turned on when the clock signal CK is low. This drives the internal nodes 121 and 122 high because transistors 201 and 204 are turned on. Since the internal node 121 is maintained at a high level, the output signal, that is, the pulse signal P is low. In this case, the NMOS transistor 209 is turned off by the pulse signal P being low. While the clock signal CK is maintained at a low level, the PMOS transistors 201 and 204 are used as precharge transistors for respectively precharging the internal nodes 121 and 122 to the power voltage.

When the clock signal CK transitions from low to high, the NMOS transistors 203 and 205 are turned on, while the PMOS transistors 201 and 204 are turned off. As the NMOS transistor 203 is turned on by the clock signal CK, and the internal node 122 is maintained at a high level, the internal node 121 is grounded by the NMOS transistors 203 and 207. As a result, the pulse signal P transitions from low to high. As the pulse signal P goes high, the NMOS transistor 209 turns on, thereby discharging internal node 122 to ground and causing the PMOS transistor 202 to turn on. Accordingly, the pulse signal P transitions back to the low level. At the same time, the NMOS transistor 207, which is connected to the internal node 122, turns off. At this time, a latch (or keeper) formed from inverter 210 and NMOS transistors 205 and 206 holds the internal node 122 low while the clock signal CK is active (high).

Although the pulse generator illustrated in FIG. 3 is a preferred embodiment according to the inventive principles of this patent disclosure, other pulse generators may be used consistently with inventive principles of this patent disclosure.

Figure 4:
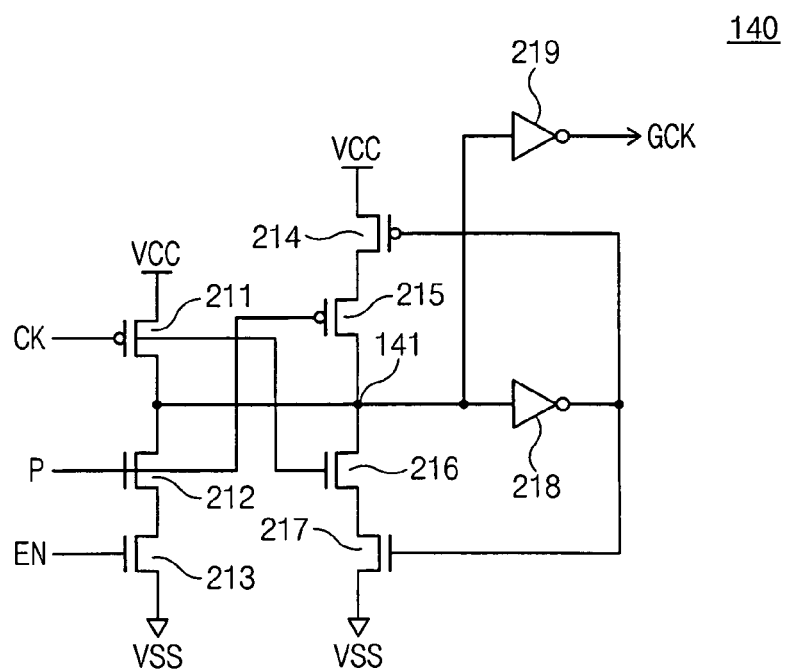
FIGS. 4 to 15 are circuit diagrams of example embodiment of precharged latches according to the inventive principles of this patent disclosure.

FIG. 4 is a circuit diagram of a first example embodiment of a precharged latch according to the inventive principles of this patent disclosure suitable for use as the precharged latch of FIG. 2. Referring to FIG. 4, the precharged latch includes a clock signal CK, a control signal EN, three PMOS transistors 211, 214, and 215, four NMOS transistors 212, 213, 216 and 217, and two inverters 218 and 219. The PMOS transistor 211 is connected between the power voltage VCC and the internal node 141, and a clock signal CK is applied to a gate thereof. The NMOS transistors 212 and 213 are serially connected between the internal node 141 and a ground voltage VSS. The pulse signal P is applied to a gate of the NMOS transistor 212, and a control signal EN is applied to a gate of the NMOS transistor 213. The PMOS transistors 214 and 215 are serially connected between the power voltage VCC and the internal node 141. The NMOS transistors 216 and 217 are serially connected between the internal node 141 and the ground voltage VSS. The inverter 218 has an input terminal connected to the internal node 141 and an output terminal connected to gates of the transistors 214 and 217. The gate of the PMOS transistor 215 is connected to receive the pulse signal P, and the gate of the NMOS transistor 216 is connected to receive the clock signal CK.

Hereinafter, the operation of a gated clock logic circuit including the precharged latch according to a first embodiment of the present invention will be more fully described referring to the accompanying drawings. As described above, the gated clock logic circuit of the present invention may be capable of reducing power consumption of integrated devices. Moreover, an embodiment of the gated clock logic circuit may be structured to generate a gated clock signal GCK fixed to a specific level (e.g., a low level) irrespective of transitions of the clock signal CK when the control signal EN is inactive. This will be more fully described as follows.

While the clock signal CK is inactive (low in this example), as previously mentioned, the pulse signal P is held enactive (low), and NMOS transistor 212 of the precharged latch 140 is turned off by the pulse signal P, and the PMOS transistor 211 is turned on by the clock signal CK. This causes the internal node 141 of latch 140 to be precharged to the high level. As a result, the gated clock signal GCK is held low while the clock signal CK is held low, irrespective of the state of the control signal EN.

As the clock signal CK transitions from low to high, the pulse signal P also transitions from low to high. As a result, the PMOS transistor 211 is turned off, and the NMOS transistor 212 is turned on. For the purpose of explanation, if it is assumed that the control signal EN is active, the internal node 141 is grounded through the NMOS transistors 212 and 213 due to the high level of the pulse signal P. That is, the gated clock signal GCK transitions from low to high. If the clock signal CK goes high, and the internal node 141 goes low, the internal node 141 is held low by the inverter 218 and NMOS transistors 216 and 217, which form a latch or a keeper with inverter 218. Thus, even if the pulse signal P goes low while the clock signal CK is high, the internal node 141 is held low by the inverter 218 and NMOS transistors 216 and 217, the latch or the keeper. This means that the control signal EN and/or pulse signal P do not need be held while the clock signal CK is high. In contrast, internal node 141 may be held high by the PMOS transistor 211 together with the inverter 218 and the PMOS transistors 214 and 215 while the clock signal CK is low.

Figure 1:
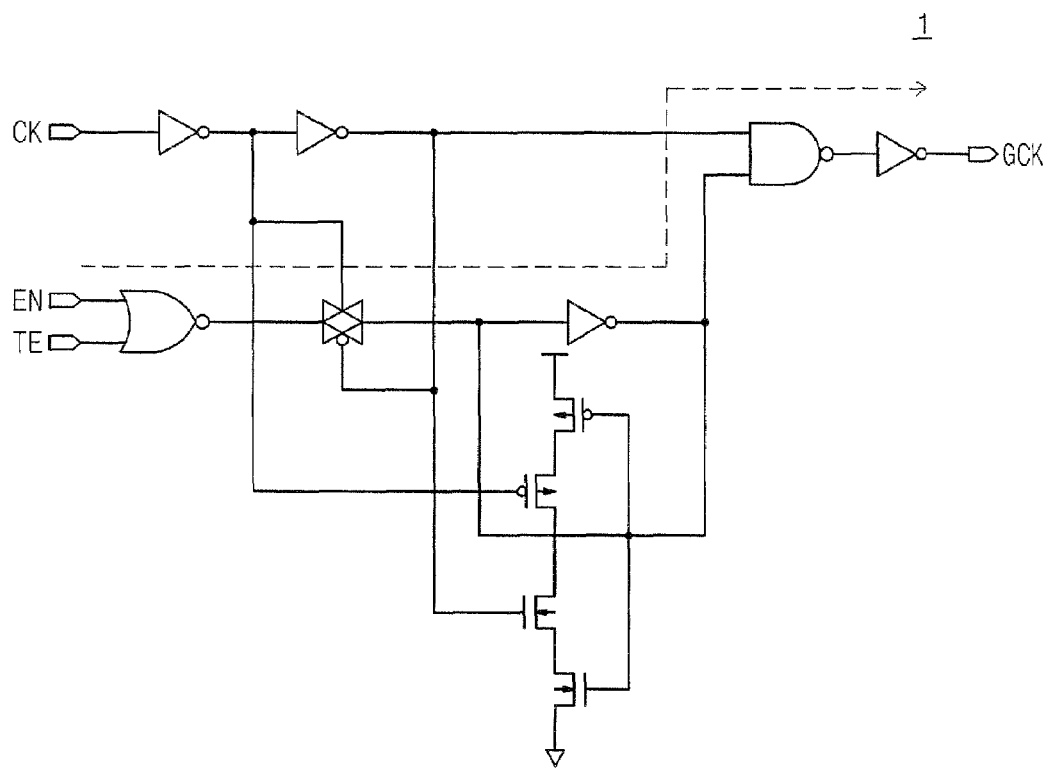
FIG. 1 is a circuit diagram of a conventional gated clock logic circuit.

As described above, the gated clock logic circuit 100 according to the inventive principles of this patent disclosure generates the gated clock signal GCK having the same waveform as the clock signal in response to the pulse signal P. In addition, the EtoG time may be reduced. That is, the number of gates forming the transmission path of the control signal EN may be reduced by approximately one half compared to the system of FIG. 1. Thus, a gated clock logic circuit according to the inventive principles of this patent disclosure may be suitable for driving high-speed, low-power flip-flop circuits.

Figure 5:
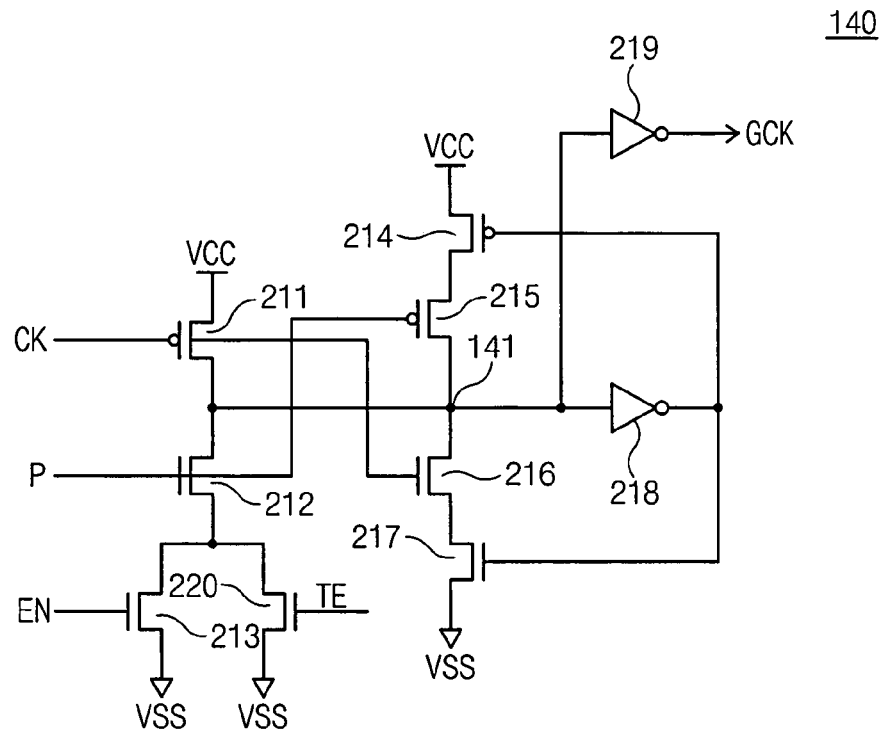

FIG. 5 is a circuit diagram showing a second example embodiment of a precharged latch according to the inventive principles of this patent disclosure suitable for use with the system of FIG. 2. Referring to FIG. 5, the precharged latch 140 of FIG. 2 is substantially the same as the precharged latch of FIG. 4 except that an NMOS transistor 220 controlled by a second control signal TE is added. In FIG. 5, the elements having the same functions as FIG. 4 are designated by the same reference numerals and thus explanation thereof is omitted. In accordance with this circuit structure, the state of the internal node 141 is determined in response to the activation of the control signals EN and TE.

Figure 6:
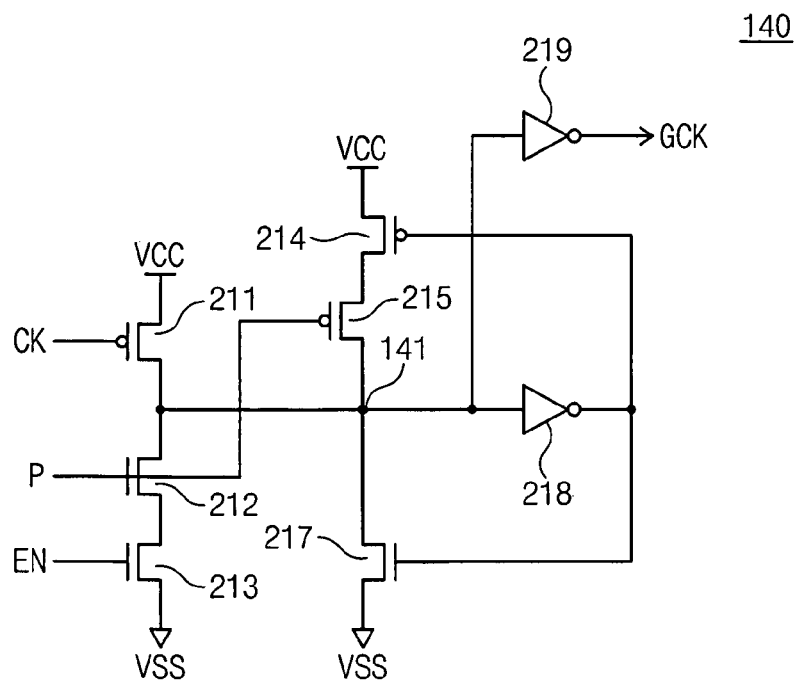

FIG. 6 is a circuit diagram showing a third example embodiment of a precharged latch according to the inventive principles of this patent disclosure suitable for use with the system of FIG. 2. Referring to FIG. 6, the third embodiment of the precharged latch 140 is substantially the same as the precharged latch of FIG. 4 except that the NMOS transistor 216 controlled by the clock signal CK is removed. In FIG. 6, the elements having the same functions as FIG. 4 are designated by the same reference numerals and thus explanation thereof is omitted.

Figure 7:
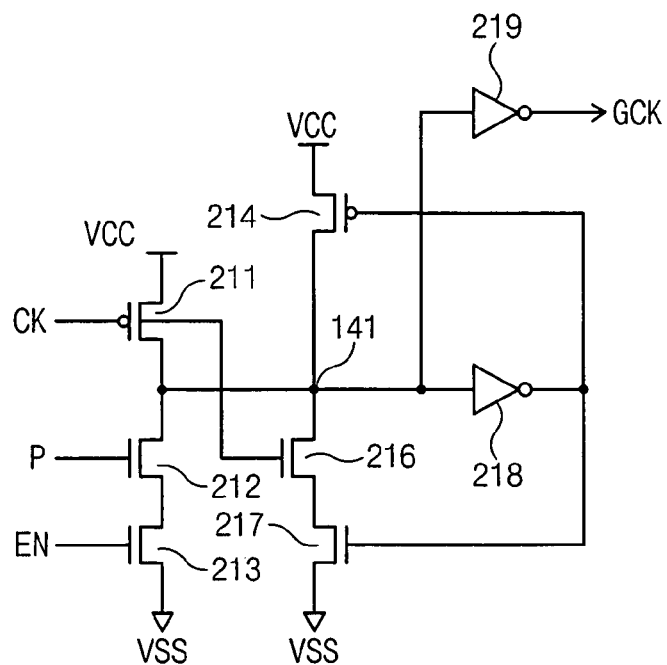

FIG. 7 is a circuit diagram showing a fourth example embodiment of a precharged latch according to the inventive principles of this patent disclosure suitable for use with the system of FIG. 2. The fourth embodiment of a precharged latch 140 of FIG. 7 is substantially the same as the precharged latch of FIG. 4 except that the PMOS transistor 215 controlled by the pulse signal P is removed. In FIG. 7, the elements having the same functions as FIG. 4 are designated by the same reference numerals and thus explanation thereof is omitted.

Figure 8:
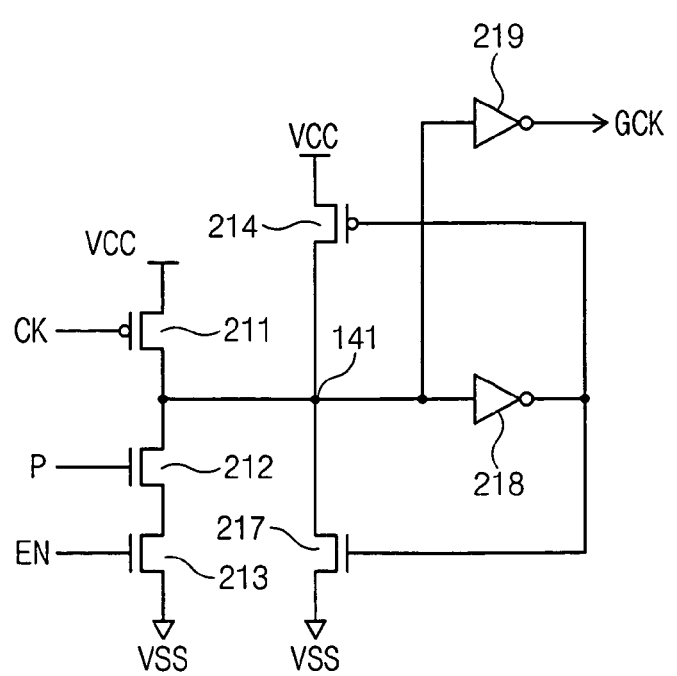

FIG. 8 is a circuit diagram showing a fifth example embodiment of a precharged latch according to the inventive principles of this patent disclosure suitable for use with the system of FIG. 2. The fifth embodiment of a precharged latch 140 of FIG. 8 is substantially the same as the precharged latch of FIG. 4 except that the NMOS transistor 216 and PMOS transistor 215 that are respectively controlled by the clock signal CK and the pulse signal P are removed. In FIG. 8, the elements having the same functions as FIG. 4 are designated by the same reference numerals and thus explanation thereof is omitted.

Figure 9:
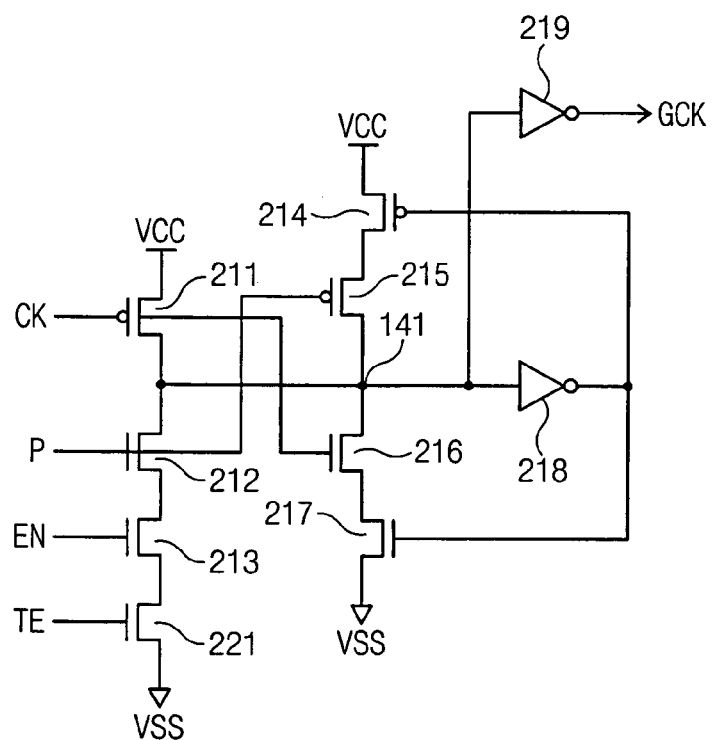
Figure 10:
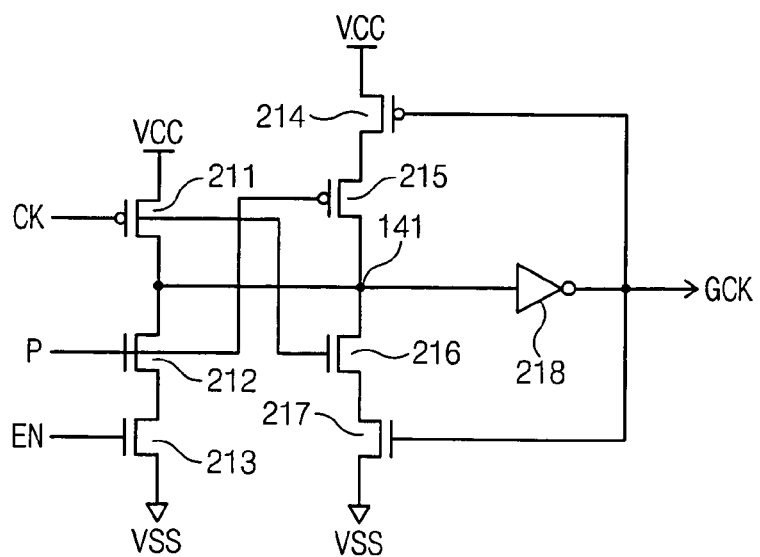
Figure 11:
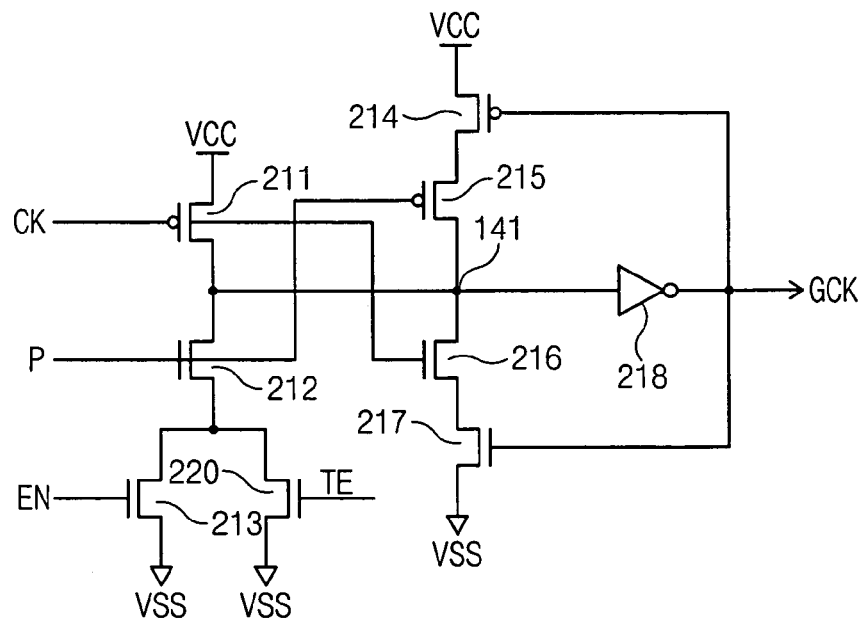
Figure 12:
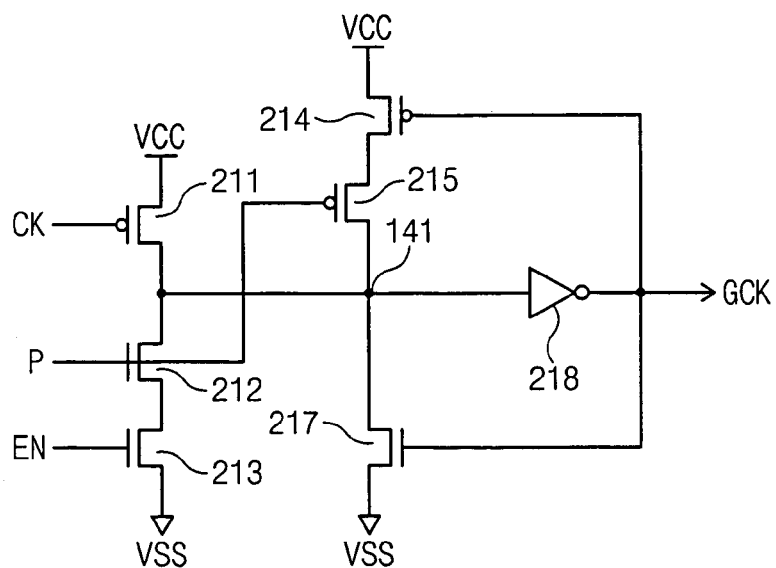
Figure 13:
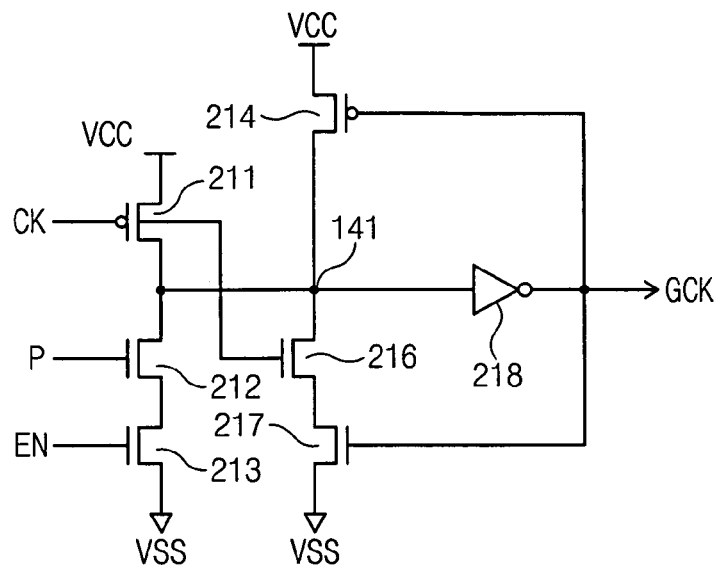
Figure 14:
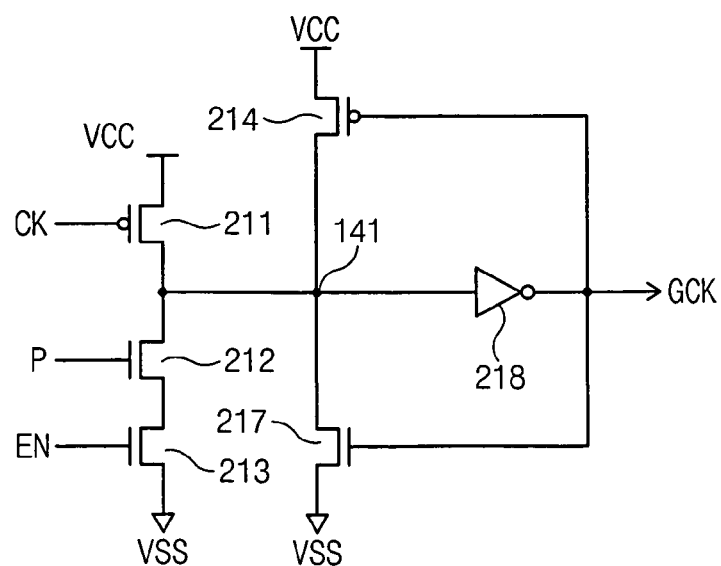
Figure 15:
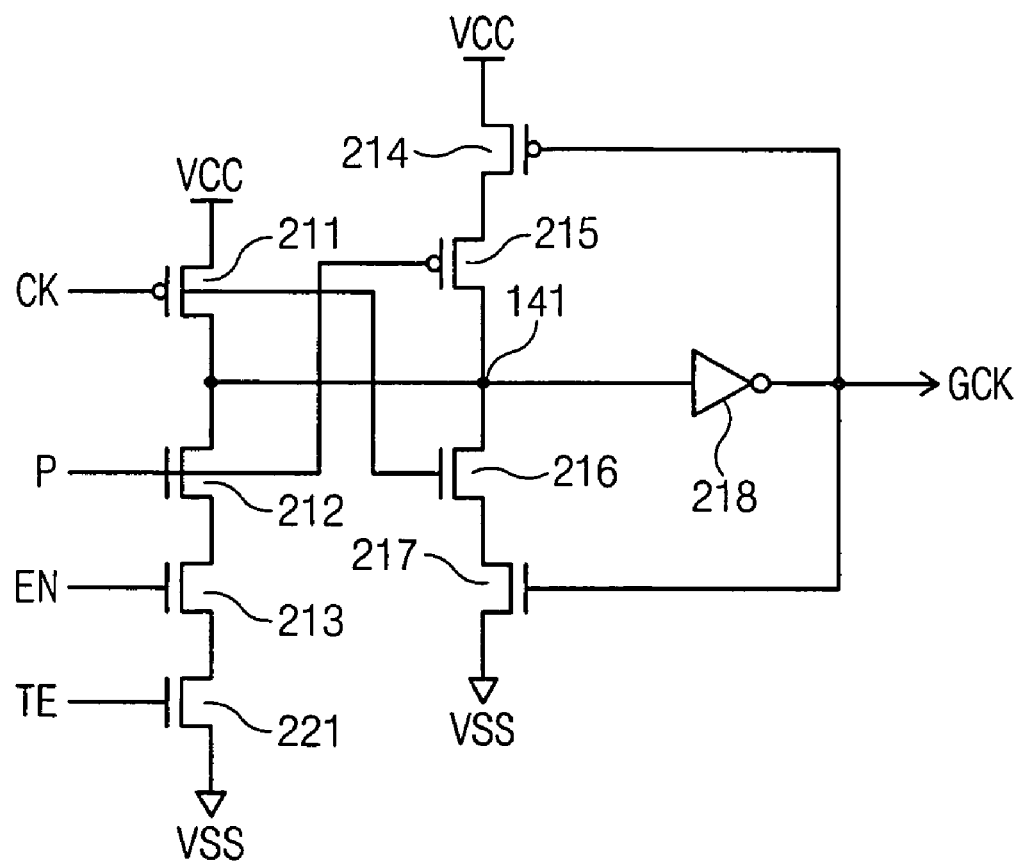

FIG. 9 is a circuit diagram showing a sixth example embodiment of a precharged latch according to the inventive principles of this patent disclosure suitable for use with the system of FIG. 2. The sixth embodiment of a precharged latch 140 of FIG. 9 is substantially the same as the precharged latch of FIG. 4 except that the NMOS transistor 220 controlled by the control signal TE is removed. In FIG. 9, the elements having the same functions as FIG. 4 are designated by the same reference numerals and thus explanation thereof is omitted. In accordance with this circuit structure, the state of the internal node 141 will be determined depending on an activation of one of the control signals EN and TE.

FIGS. 10 to 15 are circuit diagrams of example embodiments of precharged latches according to the inventive principles of this patent disclosure suitable for use with the system of FIG. 2. The embodiments of FIGS. 10 to 15 are substantially the same as the embodiments of FIGS. 5 to 9 except that the inverter 219 connected to the internal mode 141 is removed. In this circuit structure, the gated clock signal GCK is output from the inverter 218.

In the precharged latches shown in FIGS. 4 to 9, the inverter 218 driving the feedback keeper is separate from the inverter 219 that drives the gated clock signal GCK. Thus, the inverter 219 may drive a relatively large load. In contrast, the inverter 218 in the embodiments of FIGS. 10 to 15 is loaded by the feedback keeper. In the modified embodiments shown in FIGS. 10 to 15, however, an additional inverter may be serially connected to the inverter 218 to output the gated clock signal GCK.

Although the inventive principles of this patent disclosure have been described in connection with the embodiment of the present invention illustrated in the accompanying drawings, it is not limited thereto. It will be apparent to those skilled in the art that various substitution, modifications and changes may be thereto without departing from the inventive principles of this patent disclosure.

The invention claimed is:

1. A gated clock logic circuit comprising:
   a pulse generator to generate a pulse signal in response to a clock signal;
   a precharged latch to generate a gated clock signal in response to the clock signal, the pulse signal, and a control signal;
   a first transistor connected between a first power supply and an internal node, and operated in response to the clock signal;
   second and third transistors serially connected between the internal node and a second power supply, and operated in response to the pulse signal and the control signal, respectively; and
   an inverter to output the gated clock signal in response to a voltage level of the internal node.

2. The gated clock logic circuit as set forth in claim 1, wherein the precharged latch further includes a fourth transistor connected between a connection point of the second and third transistors and the second power supply, and operated in response to another control signal.

3. The gated clock logic circuit as set forth in claim 1, wherein the precharged latch further includes a fourth transistor connected between the third transistor and the second power supply, and operated in response to another control signal.

4. The gated clock logic circuit as set forth in claim 1, wherein the precharged latch further includes a feedback keeper to maintain the voltage level of the internal node.

5. The gated clock logic circuit as set forth in claim 4, wherein the feedback keeper includes:
   a fourth transistor connected between the first power supply and the internal node;
   a fifth transistor connected between the internal node and the second power supply; and
   a second inverter connected to the internal node;
   wherein the fourth and fifth transistors are controlled by an output of the second inverter.

6. The gated clock logic circuit as set forth in claim 5, wherein the feedback keeper further includes a sixth transistor connected between the internal node and the fifth transistor, and operated in response to the clock signal.

7. The gated clock logic circuit as set forth in claim 5, wherein the feedback keeper further includes a sixth transistor connected between the fourth transistor and the internal node, and operated in response to the pulse signal.

8. The gated clock logic circuit as set forth in claim 5, wherein the feedback keeper further includes:

a sixth transistor connected between the internal node and the fifth transistor, and operated in response to the clock signal; and a seventh transistor connected between the fourth transistor and the internal node, and operated in response to the pulse signal.

9. The gated clock logic circuit as set forth in claim 1, wherein the precharged latch further includes:

a fourth transistor connected between the first power supply and the internal node, and operated in response to the gated clock signal; and a fifth transistor connected between the internal node and the second power supply, and operated in response to the gated clock signal.

10. The gated clock logic circuit as set forth in claim 9, wherein the precharged latch further includes a sixth transistor connected between the internal node and the fifth transistor, and operated in response to the clock signal.

11. The gated clock logic circuit as set forth in claim 9, wherein the precharged latch further includes a sixth transistor connected between the fourth transistor and the internal node, and operated in response to the pulse signal.

12. The gated clock logic circuit as set forth in claim 9, wherein the precharged latch further includes:

a sixth transistor connected between the internal node and the fifth transistor, and operated in response to the clock signal; and a seventh transistor connected between the fourth transistor and the internal node, and operated in response to the pulse signal.

13. A gated clock logic circuit comprising:

a pulse generator to generate a pulse signal in response to a clock signal;

a precharged latch to generate a gated clock signal in response to the clock signal, the pulse signal, and a control signal;

wherein the precharged latch is structured to generate the gated clock signal in response to the clock signal, the pulse signal, the first control signal, and a second control signal; and the precharged latch circuit includes:

a first transistor connected between a first power supply and an internal node, and operated in response to the clock signal;

second and third transistors serially connected between the internal node and a second power supply, and operated in response to the pulse signal and the first control signal, respectively;

a fourth transistor connected between a connection point of the second and third transistors and the second power supply, and operated in response to the second control signal; and an inverter to output the gated clock signal in response to a voltage level of the internal node.

14. The gated clock logic circuit as set forth in claim 13, wherein the precharged latch further includes a feedback keeper to maintain the voltage level of the internal node.

15. The gated clock logic circuit as set forth in claim 14, wherein the first transistor comprises a PMOS transistor, and the second through fourth transistors comprise NMOS transistors.

16. A gated clock logic circuit comprising:

a pulse generator to generate a pulse signal in response to a clock signal;

a precharged latch to generate a gated clock signal in response to the clock signal, the pulse signal, and a control signal;

first and second precharge transistors arranged to precharge first and second internal nodes when the clock signal is inactive;

first and second discharge transistors arranged to discharge the first and second internal nodes in response to an activation of the clock signal; and a feedback keeper circuit arranged to precharge the first and second internal nodes in response to an activation of the pulse signal.

17. A gated clock logic circuit comprising:

a pulse generator to generate a pulse signal in response to a clock signal; and a precharged latch to generate a gated clock signal in response to the clock signal, the pulse signal, and a first control signal;

wherein the precharged latch includes:

a first PMOS transistor having a source connected to a first power supply, a drain connected to an internal node, and a gate connected to receive the clock signal;

a first NMOS transistor having a drain connected to the internal node, a source, and a gate connected to receive the pulse signal;

a second NMOS transistor having a drain connected to the drain of the first NMOS transistor, a source coupled to a second power supply, and a gate connected to the first control signal;

a first inverter having an input terminal connected to the internal node and an output terminal to output the gated clock signal;

a second PMOS transistor having a source connected to the first power supply, a drain coupled to the internal node, and a gate connected to operate responsive to the internal node; and a third NMOS transistor having a drain coupled to the internal node, a source connected to the second power supply, and a gate connected to operate responsive to the internal node.

18. The gated clock logic circuit as set forth in claim 17, further comprising a second inverter having an input terminal connected to the internal node, and an output terminal connected to the gates of the second PMOS transistor and the third NMOS transistor.

19. The gated clock logic circuit as set forth in claim 17, wherein the output of the first inverter is connected to the gates of the second PMOS transistor and the third NMOS transistor.

20. The gated clock logic circuit as set forth in claim 17, further comprising a fourth NMOS transistor having a drain connected to the drain of the first NMOS transistor, a source connected to the second power supply, and a gate connected to receive a second control signal.

21. The gated clock logic circuit as set forth in claim 17, further comprising a third PMOS transistor having a source connected to the drain of the second PMOS transistor, a drain connected to the internal node, and a gate connected to receive the pulse signal.

22. The gated clock logic circuit as set forth in claim 17, further comprising a fourth NMOS transistor having a drain connected to the internal node, a source connected to the drain of the third NMOS transistor, and a gate connected to receive the clock signal.

* * * * *